United States Patent [19]

Brilmyer et al.

[11] Patent Number: 4,876,513
[45] Date of Patent: Oct. 24, 1989

[54] DYNAMIC STATE-OF-CHARGE INDICATOR FOR A BATTERY AND METHOD THEREOF

[75] Inventors: George H. Brilmyer; William H. Tiedemann, both of Cedarburg, Wis.

[73] Assignee: Globe-Union Inc., Milwaukee, Wis.

[21] Appl. No.: 279,213

[22] Filed: Dec. 5, 1988

[51] Int. Cl.⁴ .............................................. G01N 27/46
[52] U.S. Cl. ..................................... 324/427; 340/636; 320/48
[58] Field of Search ........................ 324/427, 426, 430; 340/636; 320/48

[56] References Cited

U.S. PATENT DOCUMENTS 4,595,880 6/1986 Patil ..................................... 324/427

Primary Examiner—Reinhard J. Eisenzopf
Assistant Examiner—Anthony L. Miele
Attorney, Agent, or Firm—Foley & Lardner

[57] ABSTRACT

A dynamic state-of-charge indicator for a storage battery characterized by a discharge curve relating available energy of the battery to a contemporaneous voltage over a range of voltage boundaries having predetermined end points corresponding to fully charged and effectively discharged for one charge cycle. The indicator includes a microprocessor for storing predetermined relationships between the contemporaneous voltage and the state-of-charge of the battery. A voltage sensor and a current sensor are connected to monitor battery voltage and current flow, respectively, and to provide corresponding voltage and current signals to the microprocessor. The microprocessor periodically computes the internal resistance of the battery, the average voltage and current for a predetermined discharge time period and a corrected voltage as a total of internal resistance voltage loss and average voltage with the state-of-charge being determined as a function of the corrected battery voltage.

10 Claims, 4 Drawing Sheets

DYNAMIC STATE-OF-CHARGE INDICATOR FOR A BATTERY AND METHOD THEREOF

BACKGROUND OF THE INVENTION

1. Technical Field

The present invention relates, generally, to a state-of-charge indicator which exhibits the dynamic capacity of a battery and, especially, a lead-acid storage battery. The present invention relates more particularly to a state-of-charge indicator which is generally self normalizing with respect to variables such as temperature and age of the battery. This invention involves both the indicator, per se, and its method of implementation.

2. Description of the Background Art

The art of lead-acid storage batteries is highly refined; these devices have been utilized commercially for about 125 years. Since its introduction, the lead-acid storage battery has distinguished itself as a highly efficient and reliable electrochemical energy source relying on the double sulfate reaction, characterized by an energy efficiency in excess of 80% with coulombic efficiencies as high as about 95%. Lead-acid storage batteries are also relatively insensitive to debilitating temperature effects over a broad practical range of about −40° to about 160° F., lending them to a broad range of utility. Accordingly, the commercial adaptability of lead-acid storage battery technology continues to burgeon.

Transportation is one example of a commercially intriguing use for lead-acid storage batteries. Batteries have been used for small or personal vehicular movement for quite some time. For example, batteries have been used effectively for golf carts, wheelchairs, or similarly small-scaled transportation devices. Great interest has been peaked in the adaptability of storage batteries to provide adequate locomotion for larger vehicles. The so-called "electric car" relies heavily on the regenerative ability of lead-acid storage batteries to provide adequate power for transportation over reasonable distances, such as 50 or more miles, without the need for recharging. Along these lines, it is of obvious importance to a user of such a vehicle that he has the ability to complete his travels at a destination having the ability to recharge or replace the batteries responsible for motive power. Currently, because of the rarity of electric vehicles for general transportation, facilities do not exist as a general matter and travel must be carefully scheduled and monitored. In turn, these needs compel a reasonable ability to monitor the state-of-charge of the energy source much like an internal combustion engine is accompanied by a fuel gauge to indicate the quantity remaining for continuing travel.

The need for a reliable state-of-charge indicator has not gone unnoticed in the prior art. A wide variety of proposals have surfaced to monitor the state-of-charge of a battery or battery system on a real-time basis. The following systems are representative.

U.S. Pat. No. 4,423,378 discloses an automotive battery test apparatus for examining the condition of a storage battery used as a "SLI" (starting, lighting and ignition) battery for an internal combustion engine. The system disclosed in the '378 patent tests the condition of the storage battery and provides an indication under varying conditions. More specifically, the battery testing device measures battery voltage under (a) open circuit conditions; and (b) while the battery is subjected to a predetermined AC load and a predetermined DC load. The temperature of the battery is monitored as well. A microprocessor utilizes the open circuit potential, the measured potential under both DC and AC loading, and the temperature to ascertain the characteristics of the battery. For example, internal resistance is determined and, should it be found to be excessive (e.g., greater than 20 millions), the battery is deemed defective. Open circuit voltage, internal resistance and temperature provide inputs for calculating the estimated power at a fully charged state. The apparatus then discharges the battery through a reference load for about 15 seconds at constant load and measures a 15 second battery voltage; this voltage is then compared to a similar voltage of a battery at about 75% state-of-charge under the same condition. If the measured voltage is higher than that from the library values maintained on the computer, the battery condition is deemed good. Thus, performance benchmarks are ascertained with a view toward determining battery capability.

U.S. Pat. No. 4,433,295 also concerns an apparatus for determining the general state-of-charge of a battery. This approach, however, requires the battery to be taken from its circuit and associated with a calibrated resistor to determine state-of-charge. The process requires the battery to be subjected to two loads, one corresponding to a minimum current consumption level and the other a maximum consumption level or load. The process includes monitoring the load condition between the minimum and maximum load possibilities, periodically connecting the battery to a reference load when the minimum load is applied to the battery sampling the voltage across the reference load and comparing the sample voltage to an array of predetermined levels, each corresponding to a different state-of-charge. The comparison thereby yields an indication of the current conditions of the battery.

U.S. Pat. No. 4,394,741 concerns an interesting approach to determining state-of-charge based on the integration of current. During the first portion of the discharge, the device evaluates the state of charge by integrating the current after compensating it for the rate of discharge. Later in the discharge the state of charge of the battery is determined from the lowest subpack voltage corrected for polarization. Battery polarization is used to calculate a corrected battery voltage which is used to terminate discharge at an appropriate time.

U.S. Pat. No. 4,423,379 discloses a "go/no/go" battery tester which pulls a high current to estimate internal resistance and to understand the condition of the battery under test. The system disclosed in the '379 patent is microprocessor controlled, as are several of those discussed above, allowing rapid evaluation of the battery under test.

SUMMARY OF THE INVENTION

The state of charge indicator, according to the present invention, provides an apparatus for determining the dynamic state of charge of a lead acid battery by calculating the remaining capacity or state of charge of the battery as a function of the battery voltage under an applied load and corrected to compensate for internal battery resistance. It is generally understood that the voltage directly reflects the performance of the battery in regard to all operational variables, some of which are not completely understood or even identified as yet. It has been found that the only corrections which need be made to the voltage are those associated with the internal resistance losses of the battery. Temperature corrections are not necessary unless the state of charge must be referenced to a temperature other than the operating temperature of the battery.

In this regard, it has been determined that the battery voltage, once corrected for internal resistance voltage loss, is a composite measure of all electrode polarizations in the system. Under most operating conditions, the total polarization and extractable capacity of the lead acid battery is controlled by the availability of acid within the porous electrodes. Therefore, the internal resistance corrected voltage can be used to assess the degree of concentration polarization in the system which in turn is a representative measure of the state of charge of the battery.

DETAILED DESCRIPTION OF THE DRAWINGS

A preferred exemplary embodiment of the present invention will hereinafter be described wherein like numerals denote like elements and:

DETAILED DESCRIPTION OF A PREFERRED EMBODIMENT

The present invention is concerned with a battery fuel gauge that relates the remaining capacity or state of charge of a battery to the battery voltage under an applied load. Simply described, the invention relates to an empirically based calculation of the dynamic state of charge of a lead acid battery during a discharge cycle based upon the specific characteristics of that battery. Lead acid batteries of a specific configuration are known to exhibit the same discharge characteristics between the states of fully charged and fully discharged. Although the invention is described herein with respect to a lead acid battery, batteries which exhibit the same or similar discharge characteristics are considered to be within the contemplation of this invention.

Figure 1:
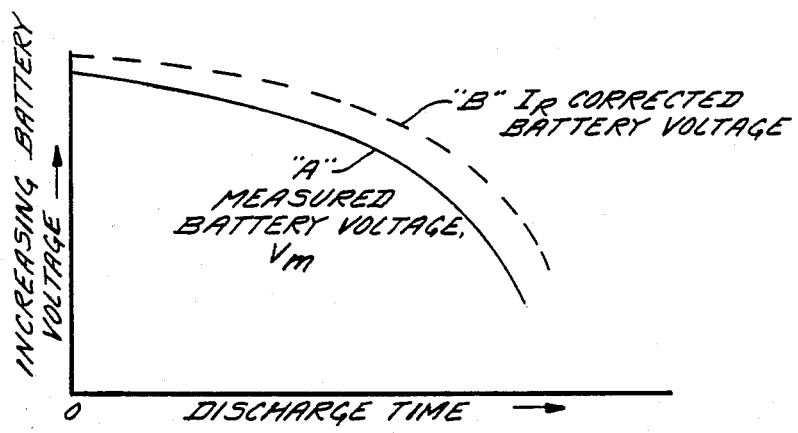
FIG. 1 shows the typical shape of a voltage discharge curve and the corresponding shape of the voltage curve corrected to include the battery internal resistance.

In order to provide an accurate indication of the state of charge of the battery, the voltage measurement $V_m$, is corrected to include the voltage loss, $V_{ir}$, associated with the internal resistance of the battery. The voltage losses are attributable to a number of factors such as age, temperature, conductivity of all the lead parts of the battery, i.e. The posts, grids and paste, the acid and the paper or glass separator. A further complication is the chemical reaction occuring during discharge which alters the concentration of the acid and composition of the battery plates. For a given internal resistance, the voltage drop associated with that resistance is a function of current. By measuring the current surges and corresponding voltage drop on an ongoing basis, the internal resistance can be continuously monitored and the voltage loss attributed to that resistance can be added back into the measured voltage to provide a common voltage corrected discharge curve representative of the battery discharge characteristics. In FIG. 1, the discharge curve "A" of a lead acid battery represents the normal or uncorrected curve and the discharge curve "B", the curve corrected for internal resistance.

In order to implement a battery fuel gauge which is based on an internal resistance corrected cell voltage measurement, $V_C$, several guidelines had to be established. A voltage window is chosen which adequately describes the operating voltage range of the battery.

Figure 2:
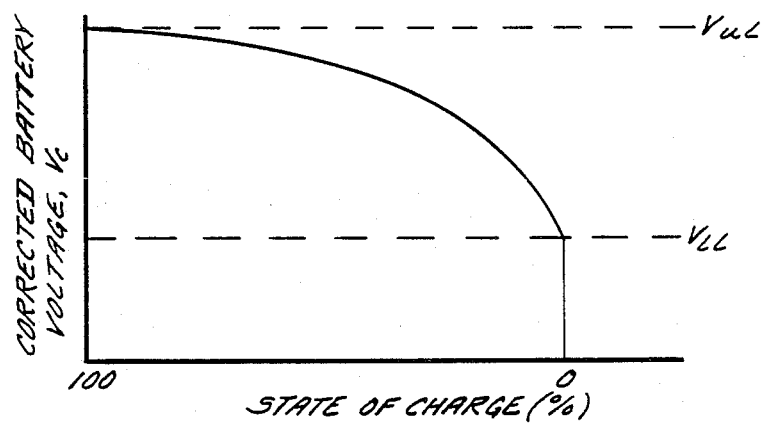
FIG. 2 is a graphical representation of the operating range of the battery.

The voltage window is determined experimentally and the limits defined accordingly. During discharge the battery is considered fully charged (SOC=100) when the corrected voltage, $V_c$ equals the upper voltage limit, $V_{UL}$ as shown in FIG. 2. Conversely, the battery is considered fully discharged (SOC=0) when the corrected voltage, $V_c$ equals the lower voltage limit, $V_{LL}$. Therefore by referring to FIG. 2, the relationship between the state of charge (SOC) and the corrected battery voltage, $V_c$ can be defined in graphical form.

In order to accurately determine and calculate the state of charge of the battery using the corrected voltage, $V_c$, the relationship between $V_c$ and SOC must be expressed mathematically. One method of describing this non-linear relationship is to utilize a multiordered polynomial equation such as the following:

$$SOC = A + B(V_c) - C(V_c)^2 + D(V_c)^3$$

A = −27,454.49
B = 45,651.83
C = −25,340.78
D = 4,695.90

The exact values for the constants for the 3rd order polynomial used in the equation are a function of the battery design and condition. In other words, the relation between $V_c$ - SOC curves are design and condition dependent and must be determined for each battery tested. The method developed herein assumes that in order to apply this fuel gauge technique to a particular battery, the $V_c$ - SOC curve must be determined and fitted to the polynomial as shown above. In this manner the state of charge of the battery can be calculated from the corrected battery voltage at any time during the discharge process. During the life of the battery the $V_c$ - SOC curve is refitted periodically to compensate for variations in battery condition for improved accuracy.

Conventional methods of determining the battery amphour capacity typically have difficulty in determining the state of charge of a lead-acid battery because of the extreme dependence of the capacity of the battery on the discharge rate. Table 1 shows this relationship for a state of the art lead-acid battery.

TABLE 1
CONSTANT CURRENT DISCHARGE RATINGS TO 1.75 VOLTS/CELL

| Discharge Rate (Hrs.) | Discharge Current (AMPS) | Capacity (AMPHOURS) |
| --- | --- | --- |
| 1 | 101 | 101 |
| 3 | 42 | 126 |
| 5 | 28 | 140 |
| 8 | 18 | 144 |
| 12 | 13 | 156 |

The amount of charge available (amphours) decreases as the discharge current is increased. Therefore a discharge rate correction factor is generally required to obtain an accurate measure of anticipated capacity in assuming amphours are the measured parameter. The proposed battery fuel gauge technique has no need for correction for discharge rate since battery capacity is not measured in terms of amphours remaining. The basic principle of operation, i.e., the relationship between state of charge and the corrected battery voltage, eliminates the need for a rate correction and has proved viable over a wide range of operating rates. The capacity remaining is presented in terms of state of charge, SOC, which is a relative number ranging from 0-100%.

Figure 3:
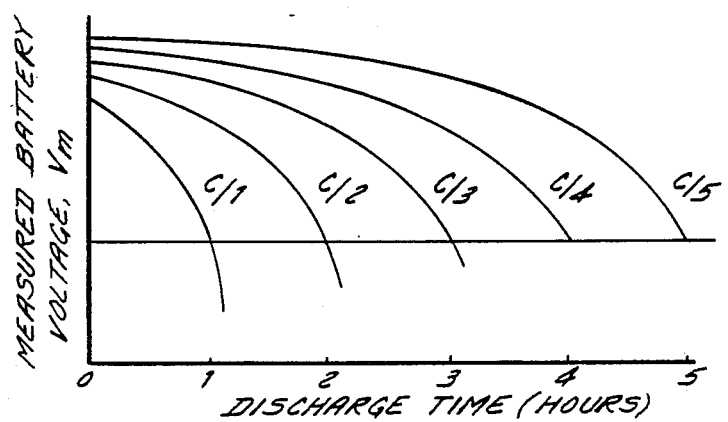
FIG. 3 shows a series of typical discharge rate over time curves for 1, 2, 3, 4 and 5 hour discharge rates.
Figure 4:
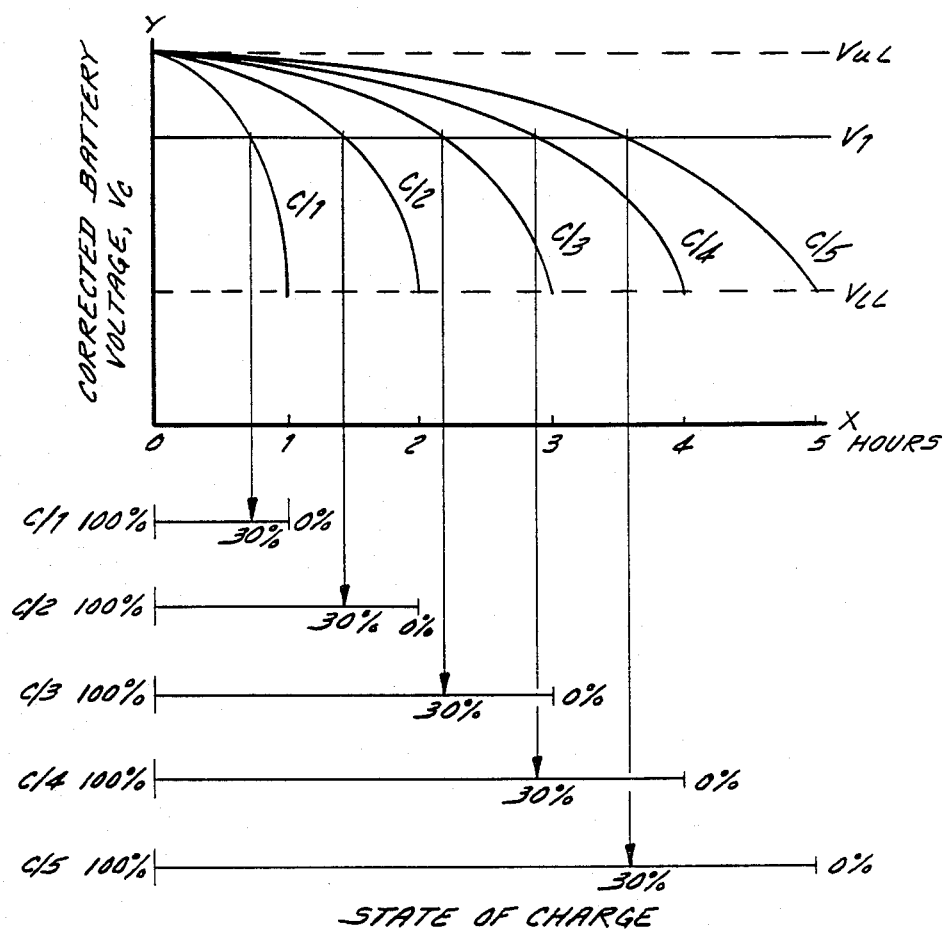
FIG. 4 shows the voltage corrected discharge rate over time curves for the discharge rate over time curves of FIG. 3.

The basic relationship between discharge and uncorrected battery operating voltage is shown in FIG. 3. In this uncorrected form, the direct relationship between voltage and state of charge is not readily apparent. The relationship becomes more evident when this data is corrected for the internal resistance losses in the battery as shown in FIG. 4. By defining the voltage upper limit, $V_{UL}=SOC=100\%$ and the voltage lower limit, $V_{LL}=SOC=0\%$ then for example, for $V_c=V_1$, the relative state of charge can be determined. The X-axis of the graph in FIG. 4 is first converted from units of time (i.e. hours) to state of charge (%). This is done for each voltage curve in relative SOC units such that at each different rate the state of charge starts at 100% and ends at 0% over the prescribed discharge period. (Note that 5 different X-axis' are required to display this information.) In this form a horizontal line drawn through the voltage $V_1$, is then used to reflect the state of charge of the battery during each individual discharge. The intersection of the horizontal line with the individual discharge curves translates to the same relative state of charge value on each of the five X-axis' (i.e. 30% in this example).

The key point to be noted is that the corrected battery voltage can be directly related to the state of charge, independent of discharge rate using the polynomial. As shown in FIG. 4, at voltage $V_1$, the state of charge equals 30% at any or all discharge rates. Therefore if the corrected voltage of the battery is known, the state of charge can be determined directly from the polynomial. Furthermore, if the average discharge rate (or vehicle speed) is known, then this information can be used to estimate amphours (or miles) remaining.

Figure 5:
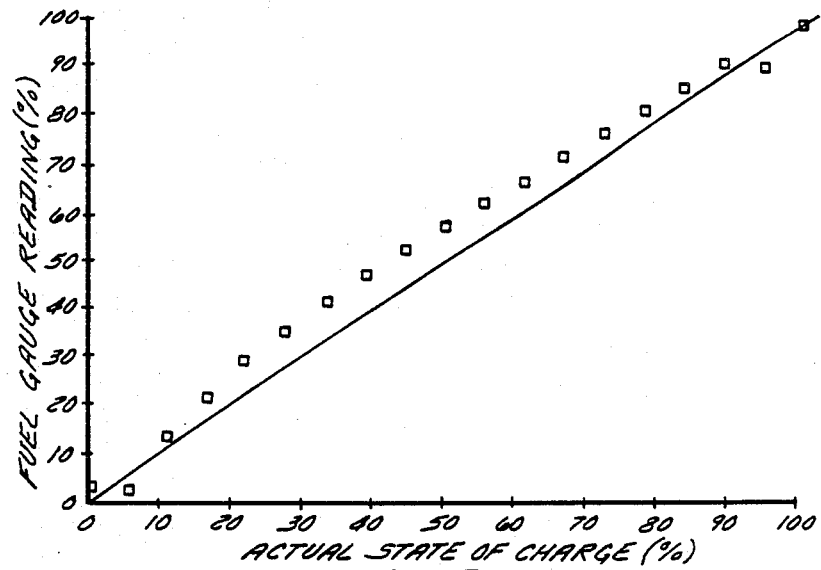
FIG. 5 shows a series of voltage discharge test curves made under three actual test cycles to verify the accuracy of the shape of the discharge curves.

This voltage based Fuel Gauge concept has been tested and proven under various operating conditions and battery types. Tests have been conducted under both constant current and J227 driving cycle discharge sequences. FIG. 5 shows the results comparing the calculated Fuel Gauge Reading to the Actual State of Charge during a constant current discharge test done on a GC6-1500 celled battery. The test represents a test discharge at a constant current at the C/3 rate. In this Figure the calculated data points are compared to the expected linear relationship between the Fuel Gauge reading and the State of Charge. The results are well within the acceptable limits.

Figure 6:
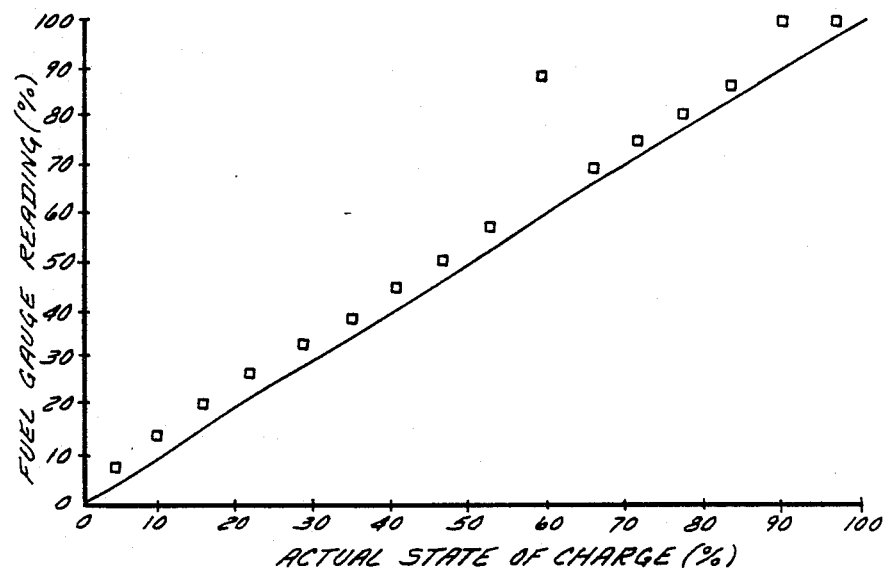
FIG. 6 is a comparison of the fuel gauge data of cycle 1 of FIG. 4 and the fitted curve determined by the polynomial of equation 4.

A more rigorous test of the fuel guage is that shown in FIG. 6. This test data represents that obtained during a J227 a/d driving cycle at the net C/3 rate. The actual charge and discharge currents used in the cycle are listed in Table 2.

TABLE 2
J227 a/d Driving Cycle Profile

| Phase | Mode | Current (amps) | Duration (seconds) |
| --- | --- | --- | --- |
| Acceleration | Discharge | −211 | 25 |
| Cruise | Discharge | −67 | 50 |
| Rest | Open Circuit | 0 | 30 |
| Regenerative Braking | Charge | +101 | 15 |

This cycle has a net discharge current of −68 amps and a duration of 2 minutes. During this type of discharge test the driving cycle as shown above is repeated until the battery voltage reaches a value of 1.5 volts/cell during the acceleration phase of the cycle. Under this type of non-steady state operation the fuel gauge technique is applied by time averaging the voltage and current only during the discharge phases of the cycle. Thus the open circuit and charging phases of the cycle are ignored by the fuel gauge but their impact ultimately effects the behavior of the battery during discharge.

Figure 8:
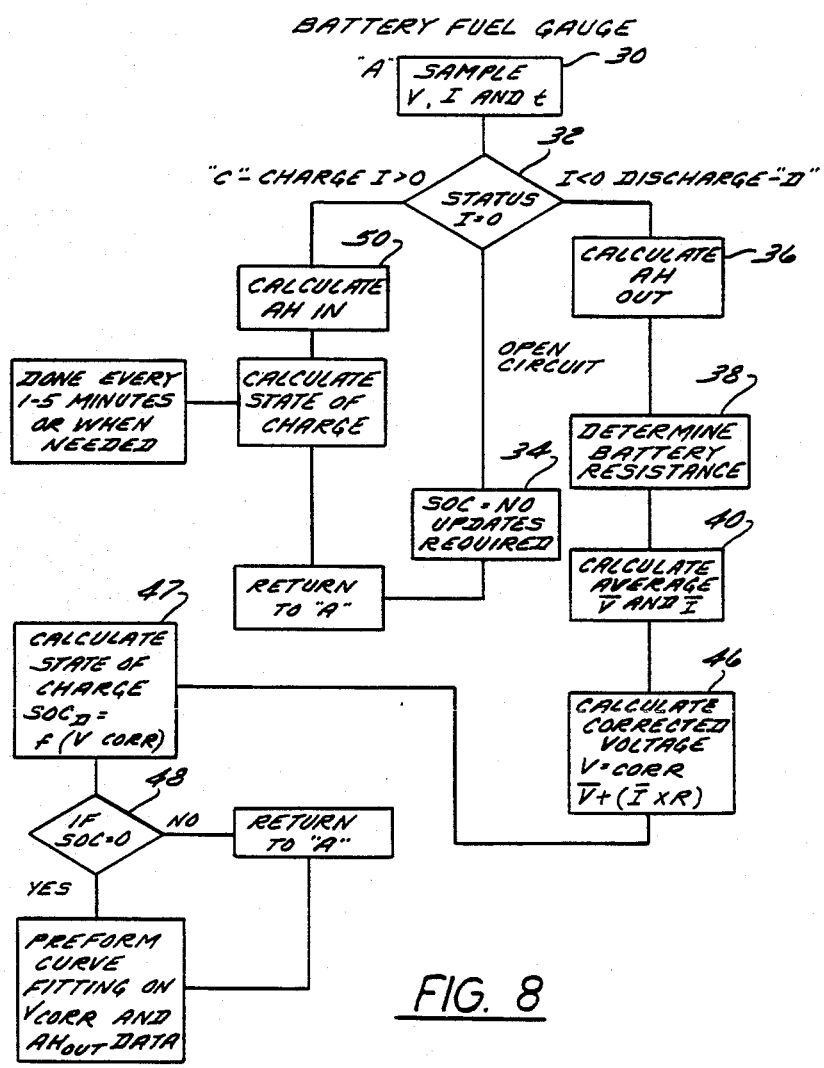
FIG. 8 is a flow chart showing the steps performed by a microprocessor for generating a state of charge signal for the battery.

A complete microprocessor controlled battery Fuel Gauge System has been developed using a stand alone micro-computer with the appropriate input/output boards and meters. The fuel gauge is only a portion of the comprehensive FG System and is itself only required for determining the state of charge of a battery during a period of net discharge. A schematic of the complete FG System is shown in FIG. 8. During operation of the system the microprocessor continuously samples the battery voltage and current independently of the operation of the battery. When the microprocessor determines that the battery is undergoing a net discharge (despite the occurrence of short periods of open circuit and charge) the fuel gauge calculations are performed as described above and as shown in part D of FIG. 8. When the battery is deemed to be in a charging mode (i.e., when I>0 for more than 2 consecutive sampling periods) the computer executes an amphour calculation and computes the state of charge as shown in FIG. 8, Part "C". Periods of inactivity are handled via the open circuit part of the schematic.

Figure 7:
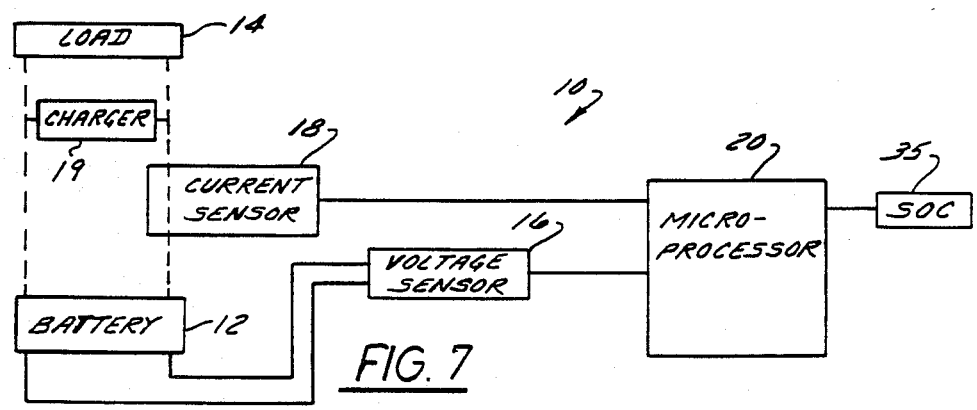
FIG. 7 is a block diagram showing the principle components of battery state of charge fuel gauge according to the present invention.

Referring to FIG. 7, a schematic diagram of the battery fuel gauge system 10 is shown for monitoring a battery 12 or a number of batteries to determine the state of charge of the battery or batteries at any instant of time. The battery 12 is connected to a load 14 such as an electric car or the like. A battery charger 19 is connected across the load 14. A sensor means for sensing voltage 16 is connected across the battery 12 and a sensor means for sensing current 18 is connected to sense current in the load circuit and current in the charger circuit. The voltage sensor means 16 and current sensor means 18 are connected to a microprocessor 20.

The state of charge of the battery is determined by the sequence of steps as indicated in the flow chart shown in FIG. 8. In a first step 30, samples of the sensed voltage $V_m$, and current I from the voltage sensor means 16 and current sensor means 18 are entered in the microprocessor along with elapsed time t. A status check is made at a second step 32 to determine the mode of operation, charge, "C", discharge "D" or open circuit. If in the open circuit mode, the present state of charge, SOC, of the battery is indicated by a LED 34 connected to the microprocessor.

If the battery is in the discharge mode, "D", the following sequence of events are performed by the microprocessor. An initial calculation of amphours out, $AH_{out}$, is recorded at a third step 36. In a fourth step 38, the battery internal resistance $R_I$ is calculated.

The internal battery resistance can be determined by the microprocessor in one of the following methods. In one method, each time the microprocessor senses an acceleration or surge in the monitored battery current, a calculation of internal resistance is made based on the current surge and corresponding voltage drop in the monitored battery voltage. The calculated internal resistance is then compared with the previous calculated internal resistance and if there is only a slight variation the previous internal resistance is used in the next calculation of corrected voltage. If there is a large variation the last recorded internal resistance is used in the calculation.

In the second method, internal resistance is measured directly by means of a Electron Milliohm Meter. This meter determines battery resistance via an applied AC current and corresponding measurement AC voltage. The microprocessor is connected to monitor the Milliohm Meter reading directly.

If the fuel gauge system is used in an automobile, the internal resistance can be calculated from the automobile alternator by connecting the microprocessor to sample the chopped DC current produced the alternator. The microprocessor also samples DC voltage directly off of a shunt circuit connected across the battery. The microprocessor then calculates internal resistance from the DC voltage and current samples.

In a fifth step 40 the microprocessor makes periodic calculations of average voltage, $\overline{V}$, and current, $\overline{I}$, for a specific time t. In a sixth step 46 the microprocessor a calculates the corrected voltage, $V_c$, by adding the average voltage, $\overline{V}$, to the internal resistance voltage loss, $\overline{IR}$. In a seventh step 47, the microprocessor calculates the state of charge using the correlated voltage, $V_C$, in the polynomial.

In an eighth step 48 if the state of charge equals "zero", the microprocessor compares the calculated discharge curve with the previous discharge curve. If a substantial difference is indicated, a curve fitting is performed by the microprocessor by recalculating the constants for the polynominal from the curve based on the discharge curve developed from the average $V_C$-$SOC_D$ curve developed during the discharge cycle. If the SOC does not equal "zero", the microprocessor returns to A. The fuel gauge as described above can be used as an independent unit to show the state of charge of a battery.

In the fuel gauge system, as shown in FIG. 8, the fuel gauge is used in combination with a charging system to provide an amphour calculation of state of charge ($SOC_C$). As shown in FIG. 8, whenever the battery is in the charge mode, "C", a calculation is made of amp hours in, $AH_{in}$, in a nineth step 50. The microprocessor then calculates $SOC_C$ using the following formula:

$$SOC_C = 100 + (100 - SOC_D) + (AH_{in} - AH_{out})/AH_{out}$$

This calculation also provides an indication of the amphours required to recharge the battery.

It will be understood that the foregoing description is of a preferred exemplary embodiment of the present invention and that the invention is not limited to the specific forms shown. Modifications may be made in design and arrangement thereof within the scope of the present invention, as expressed in the appended claims.

We claim:

1. A dynamic state of charge indicator for a storage battery characterized by a discharge curve relating available energy of said battery to a contemporaneous voltage over a range of voltage boundaries having predetermined end points corresponding to fully charged and effectively discharged for one charge cycle, said indicator comprising:
   (a) microprocessor means for storing predetermined relationships between the contemporaneous voltage and the state of charge of the battery;
   (b) voltage sensor means for monitoring battery voltage and providing a battery voltage signal to said microprocessor means;
   (c) current sensor means for monitoring current flow through said battery and providing a battery current signal to said microprocessor means;
   (d) said microprocessor means computing:
      (1) the internal resistance of said battery;
      (2) the average voltage and current for a net discharge time period;
      (3) the corrected voltage as a total of internal resistance voltage loss and average voltage; and
      (4) the state of charge as a function of the corrected battery voltage; and
   (e) means for displaying the state of charge 2. A method for determining the dynamic state of charge of a storage battery into and out of which current flows, said battery being characterized by a discharge curve relating available energy of the battery to a contemporaneous voltage over a range of voltage boundaries having predetermined end points corresponding to fully charged and effectively discharged for one charge cycle, said method comprising steps of:
   (a) monitoring the current and voltage across the battery;
   (b) determining the internal resistance of the battery from the monitored current and voltage;
   (c) calculating the average voltage and current periodically over determined time period;
   (d) correcting the average voltage to include the internal resistance voltage loss;
   (e) generating a corrected voltage signal;
   (f) applying the corrected voltage signal to the discharge curve to determine the state of charge of the battery; and
   (g) generating an output signal indicating the state of charge of the battery.

3. The method according to claim 2 wherein said determining step includes the steps of sensing current surges and voltage drops of the monitored current and voltage and calculating the internal resistance of the battery from the sensed current surges and voltage drops.

4. The method according to claim 2 wherein said determining step includes the steps of applying an AC current and measuring the corresponding AC voltage across the battery and calculating the internal resistance from the AC current and voltage.

5. The method according to claim 2, 3 or 4 including the steps of monitoring the amphours out of the battery, monitoring the amphours into the battery and calculating the amphours state of charge of the battery from monitored amphours in and out of the battery and the dynamic state of charge.

6. A method for determining the dynamic state of charge of a storage battery in an automotive vehicle connected to a alternator, comprising the steps of:
   (a) monitoring the current and voltage across the battery;
   (b) calculating the average current and voltage over a predetermined period of time;
   (c) calculating the internal resistance of the battery from the monitored current and voltage;
   (d) determining the internal resistance voltage loss from the calculated average current and the internal resistance;
   (e) correcting the average voltage calculation to include the internal resistance voltage loss;
   (f) calculating the corrected voltage by combining the average voltage with the internal resistance voltage loss; and
   (g) determining the state of charge as a function of corrected voltage, said determining step being carried out in accordance with predetermined relationship between average current, average voltage and internal resistance of the battery.

7. The method according to claim 6 wherein the step of calculating the internal resistance of the battery includes the steps of monitoring the chopped DC current of the alternator and the corresponding AC voltage ripple across the battery.

8. A method for monitoring the state of charge of a battery operating in a discharge mode comprising the steps of:
   (a) continuously monitoring the voltage of the battery;
   (b) continuously monitoring the current of the battery;
   (c) periodically computing the internal resistance of the battery from the monitored current and voltage;
   (d) computing the average voltage and average current for predetermined time periods;
   (e) correcting the average voltage for the predetermined time period by adding the internal resistance voltage loss to the average voltage;
   (f) determining the state of charge of the battery from the computed corrected voltage; and
   (i) said determining step being carried out in accordance with predetermined relationships between corrected voltage and remaining state of charge.

9. The method according to claim 8 wherein said determining step includes the steps of sensing current surges in the monitored current, sensing voltage drops in the monitored voltage and calculating the internal resistance from the sensed current surges and voltage drops.

10. The method according to claim 8 wherein said determining steps includes the steps of applying an AC current across the battery and calculating the internal resistance from the measured AC voltage.

* * * * *